United States Patent [19]

Peters

[11] 4,248,643

[45] Feb. 3, 1981

[54] SOLAR ENERGY CONVERSION PANEL

[75] Inventor: Melville F. Peters, Livingston, N.J.

[73] Assignees: Walter Todd Peters; Margot Elizabeth Peters; Albert F. Kronman; Arthur H. Steller; Grace B. Steller

[21] Appl. No.: 95,624

[22] Filed: Nov. 19, 1979

[51] Int. Cl.³ ............................................. H01L 31/00
[52] U.S. Cl. .................................... 136/248; 136/246
[58] Field of Search ..................... 136/89 PC, 89 HY

[56] References Cited

U.S. PATENT DOCUMENTS

| | | | |
|---|---|---|---|
| 2,904,612 | 9/1959 | Regnier | 136/89 |
| 2,989,575 | 6/1961 | Wallace, Jr. | 136/89 |
| 3,028,856 | 4/1962 | Daymon | 126/424 |
| 3,229,682 | 1/1966 | Perlmutter et al. | 126/440 |
| 3,427,200 | 2/1969 | Lapin et al. | 136/89 |
| 3,899,672 | 8/1975 | Levi-Setti | 350/293 |
| 4,003,756 | 1/1977 | Abrams | 136/89 PC |
| 4,023,368 | 5/1977 | Kelly | 60/698 |
| 4,081,221 | 3/1978 | Manelas | 136/89 PC |
| 4,088,121 | 5/1978 | Lapeyre | 126/424 |
| 4,106,952 | 8/1978 | Kravitz | 136/89 HY |
| 4,137,097 | 1/1979 | Kelly | 136/89 PC |

FOREIGN PATENT DOCUMENTS 2731246  1/1978  Fed. Rep. of Germany ...... 136/89 PC

Primary Examiner—Aaron Weisstuch
Attorney, Agent, or Firm—Albert F. Kronman

[57] ABSTRACT

A solar energy conversion panel is provided by means of which solar energy is recovered as converted electrical energy and also thermal energy. An array of solar energy collectors direct solar energy received from the sun upon photovoltaic cells within the collectors. The photovoltaic cells convert a portion of this energy into electrical energy. The balance of the solar energy is recovered as thermal energy which is carried from the panel by a circulating fluid. Specific shapes and arrangements of energy collectors are disclosed by means of which the energy recovered may be maximized. A means for protecting the panel from wind damage is also disclosed.

5 Claims, 6 Drawing Figures

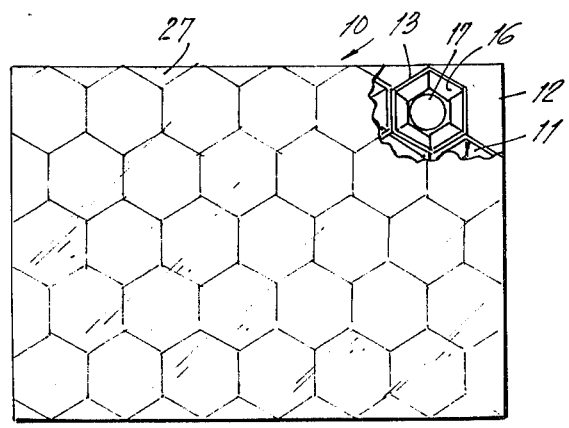
FIG. 1
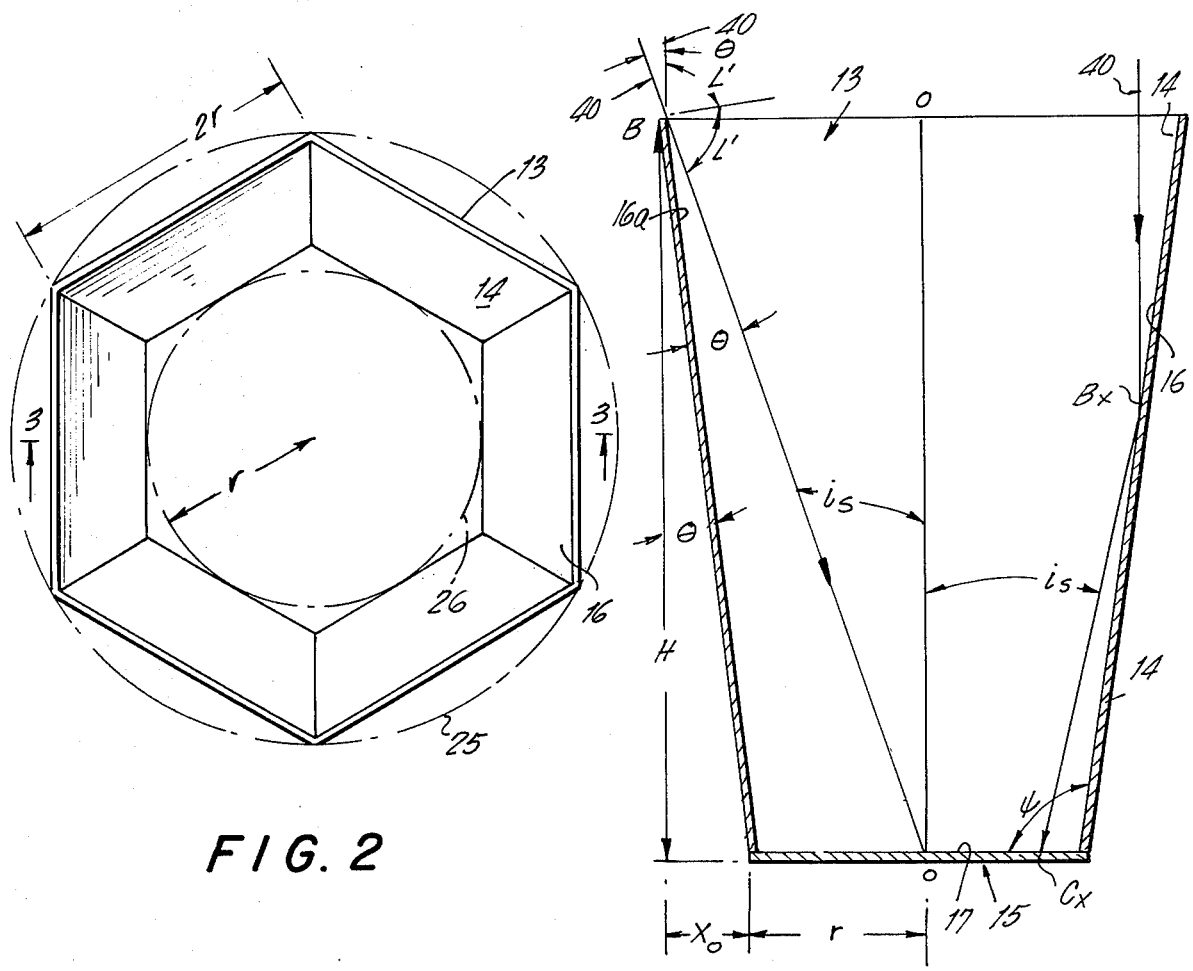
FIG. 2
FIG. 3

SOLAR ENERGY CONVERSION PANEL

BACKGROUND OF THE INVENTION

Panels for absorbing and utilizing solar energy are well-known and in wide-spread use. Such panels employ the heat energy from the sun to warm liquids or gases for various heating and cooling purposes. Other panels employ photovoltaic cells to convert solar energy directly into electrical energy. The use of photovoltaic cells has been limited because of the high cost of said cells and the fact that only about twelve percent, more or less, of the solar radiation can be converted into electricity. Prior art devices have used reflectors for the purpose of concentrating the solar energy upon photovoltaic cells in an effort to improve their output. However, the increased temperature caused by the uneven distribution of the concentrated solar rays upon the cells together with inadequate cooling often leads to their rapid deterioration.

The curvature of the reflectors used throughout the art covers all the conic sections, but none of the dimensions associated with the sections produce a uniform distribution of energy over the surface of the cells, or a constant selected angle of incidence of the rays after a single reflection from the mirror surfaces.

Since only twelve percent of the radiation impinging on the solar cell is converted into electrical energy, the remaining approximately eighty-eight percent which must be removed from the cell to prevent their overheating is available for domestic purposes such as heating. Thus the calculations based upon the percentage of electrical energy plus the thermal energy utilized for domestic purposes, will bring the cost per watt of utilized solar energy within the cost per watt of energy derived from other sources.

To provide maximum concentration of solar radiation per unit area of concentrated rays, it is necessary to employ reflectors that fit together with a high degree of close packing while satisfying the conditions of uniform distribution of the reflected solar radiation over the photovoltaic cells, and a uniform angle of incidence of the solar rays after a single reflection from the reflectors. These conditions require cone-shaped reflector units of hexagonal shape.

It is, therefore, an object of the present invention to provide an array of closely packed reflecors having a plurality of inclined reflecting surfaces which provide a uniform distribution of energy over the surface of the photovoltaic cells to achieve high energy conversion.

It is another ojbect of the invention to capture and use the energy in the fluid which cools the solar cells.

Still another object of the invention is to apply a pressure on the inner surface of a solar panel window which will equalize the pressure developed by the wind on the outer surface.

SUMMARY

In one preferred embodiment of the present invention a plurality of hexagonally shaped electromagnetic energy collecting members of substantially conical configuration are arranged in an array upon a support. A photovoltaic cell is positioned so as to substantially form the bottom portion of each of the collecting members. Sunlight incident upon the collectors is received upon the photovoltaic cells either directly or with only a single reflection from the reflective walls of the collectors. The collector support forms the top of a chamber through which a fluid is circulated to carry heat away from the photovoltaic cells which are mounted upon the support. The heated fluid is directed into a heat exchanger and used, thereby adding to the total amount of energy recovered from the incident light.

BRIEF DESCRIPTION OF THE DRAWINGS

In the accompanying drawings forming part hereof, in which drawings similar parts have been given the same reference numerals;

FIG. 1 is a plan view of a solar energy conversion panel according to the present invention.

FIG. 2 is a plan view on an enlarged scale, of a single energy collector of the array shown in FIG. 1.

FIG. 3 is a cross-sectional view taken on line 3—3 in FIG. 2.

DETAILED DESCRIPTION

Figure 6:
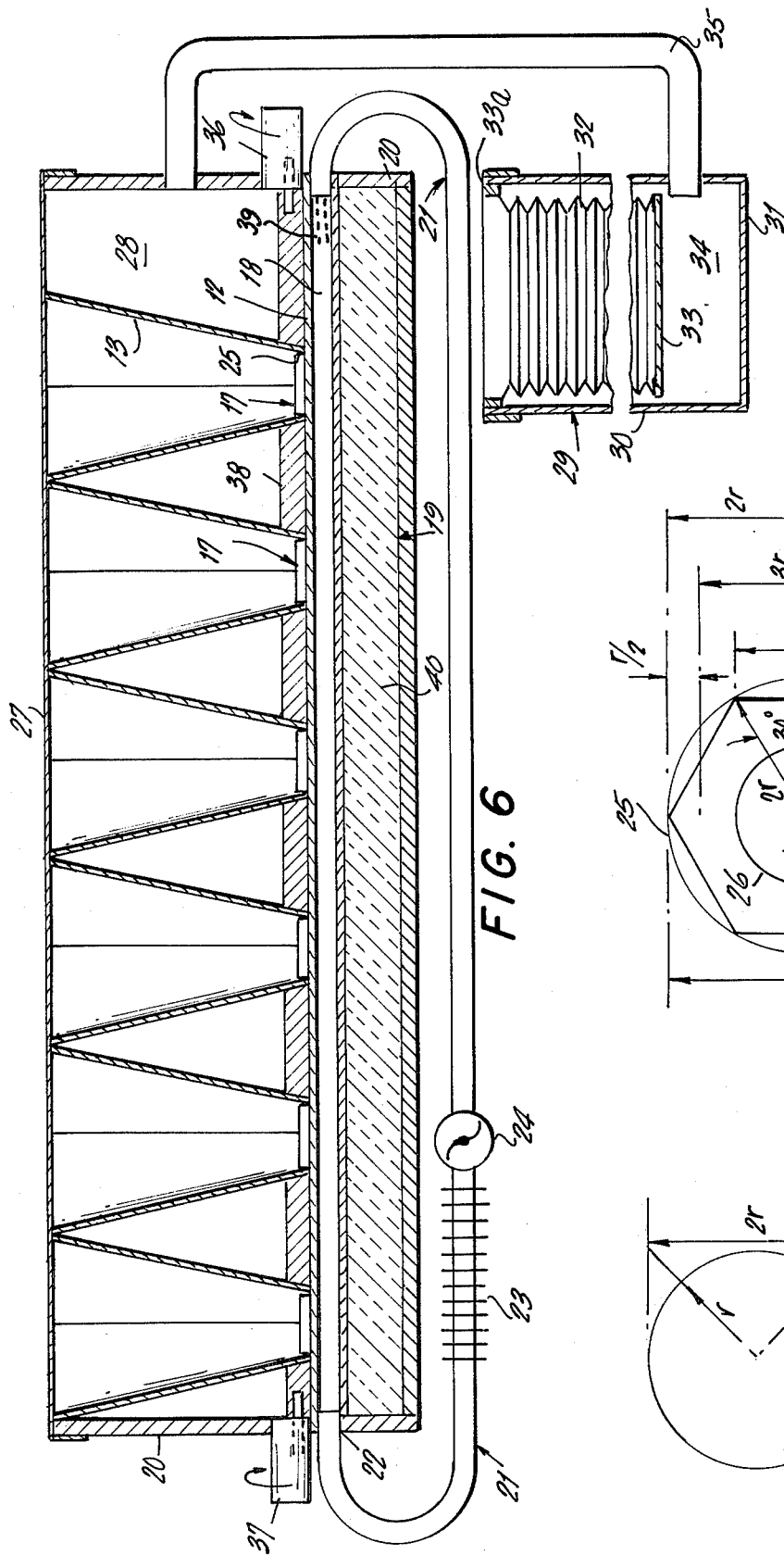
FIG. 6 is a somewhat diagrammatic cross-sectional view of a complete energy conversion system in accordance with the present invention.

Referring to the drawings and particularly to FIGS. 1–3, 10 indicates a solar energy conversion panel consisting of a plurality of individual energy collectors 11 mounted upon a flat support plate 12.

Each of the collectors 11 is made up of cuplike or conical reflectors 13 of substantially hexagonal shape, the side walls 14 of which slope inwardly toward the bottom 15. The hexagonal shape of the reflectors permits an almost 100% packing factor, as shown in FIG. 1, so that the maximum number of collectors may be mounted in a given area. This reflector shape and arrangement provides the maximum use of the solar energy incident upon the panel 10. The reflectors 13 which may be made of metal, plastic, ceramic, or glass are provided with inner surfaces 16 such as polished metal, mirrors or the like, so that light incident upon them will be directed upon the bottom 15 of the energy collector 11.

The photovoltaic cell 17, is well-known in the art. It is disposed across the bottom 15 of each collector 11. The cell 17 may cover the entire bottom surface of the collector, in which case it will have a hexagonal shape, or be disc-shaped, with the bottom of the reflector formed accordingly. The specific size relationship of the reflector elements and the angular disposition of the reflector inner surfaces 16, as hereinafter more fully described, results in all of the light incident upon the collecting units in panel 10 being uniformly distributed over the photovoltaic cells in the bottom of the collectors.

The greater the concentration of radiation on the photovoltaic cells, the lower will be the cost per watt. This concentration of solar energy on the cell without adequate cooling will lead to cell temperatures high enough to first reduce the efficiency of the cell and later to permanent damage. Thus, for example, the top limit for germanium type photovoltaic cells is about 100° C., and for the silicon type, the temperature limit is about 200° C. It is common practice to prevent the solar cells from reaching dangerously high temperatures by fluid cooling, but unless the heat transmitted to the fluid is utilized, there is a net loss in energy of approximately 88%.

In the present invention, the heat collected by the conversion panel at the bottom of each cell, is removed by a fluid 39 which is circulated through a chamber 18 best shown in FIG. 6. The support plate 12 for collector 11 forms the top of the chamber 18 and plate 19 the bottom. Thermal insulating material 40 is dispersed between plates 12, 19 to reduce thermal losses from the fluid in the chamber. Upstanding sidewalls 20 which define the perimeter of the panel 10 also form the sidewalls of chamber 18. The fluid, which may be a liquid such as water, alcohol, or a gas such as air, nitrogen or the like, is conducted to and out of chamber 18 by means of a conduit 21 which exits the chamber as indicated at 22 and thereafter passes through a heat exchanger 23 or some other apparatus for utilizing the heat extracted from the chamber by the fluid. A circulator pump 24 in the conduit 21 connected to a thermal sensing device (not shown) located within the chamber 18 serves to move the liquid through the conduit when the temperature within the chamber reaches a predetermined amount. By transmitting the thermal energy absorbed from the solar rays by the cells to the circulating fluid in chamber 18, the photovoltaic cells may be operated at a predetermined temperature and the thermal energy passing through heat exchanger 23 utilized for useful purposes, thereby improving the economics of the solar converter. The plates 12 and 19 are made of a suitable non-corrosive metal.

In order to prevent heat loss from the support plate 12 to the reflectors 13, it is desirable to thermally insulate the reflectors from the support plate.

As best shown in FIG. 6, a flat thermally insulating block 38 having a plurality of openings 25 therein may be employed to receive and secure the bottoms of the reflectors 13 therein. The photovoltaic cells 17 which may be of the germanium or silicon type, well known in the art, are thus brought into intimate thermal contact with the support plate 12 for maximum dissipation of the heat produced within the cells. The photovoltaic cells 17 should be electrically insulated from the support plate 12 while maintaining their high degree of thermal conductivity with said plate. A dielectric cement, such as is well-known in the art, may be employed to secure the cells 17/to the support plate 12. Alternately, the surface of the plate 12 might be oxidized before the photovoltaic cells are secured to the said support plate.

Referring to FIGS. 2, 3, 4 and 5, there is illustrated the geometry of the individual collectors 11 as used in the present invention. This geometry is essential in assuring that all of the incident solar energy is received upon the photovoltaic cell either directly or with only one reflection from the inner surfaces 16 of the reflectors 13. To achieve this relationship the circumscribed circle 25 must be equal to twice the diameter of the inscribed circle 26 which in turn, is equal to the diameter of the photovoltaic cell 17.

Figure 5:
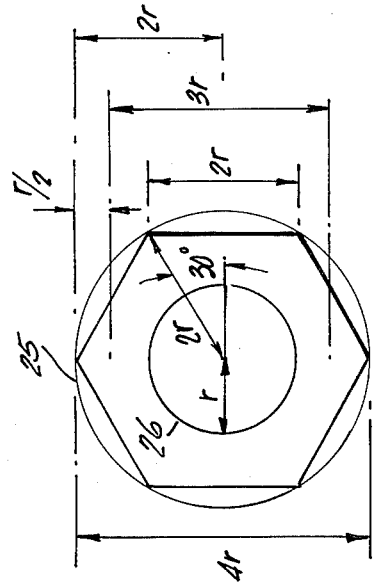
FIG. 5 is a diagrammatic plan view of a energy collector showing the relationship of the various elements.
Figure 4:
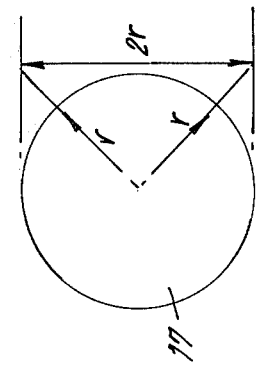
FIG. 4 is a diagrammatic view of a disc shaped photovoltaic cell of the present invention.

Referring to FIGS. 2 and 3, the solar rays 40 reflected from the inner surface at B will impinge on the center of the photovoltaic cell 15 at O and the rays reflected from surface 16 at $B_x$ will impinge in the said cell at Cx providing the angle $\psi$ is selected as hereinafter more fully set forth. Each portion of the hexagonal reflector will direct the solar energy falling upon it on that portion of the photovoltaic cell between the center of said cell and the bottom of said reflector portion, as shown in FIG. 5.

Should the angle exceed the required value, a portion of the reflected radiation would be directed upon one or more of the other sides of the hexagonal reflector, thereby reducing the amount of energy which can be converted by the collectors. If the angle is less than the calculated value, the reflected radiation would not reach the center of the photovoltaic cell and the amount of energy collected by the array will be reduced. Thus a mis-calculation of angle $\psi$ will reduce the output of the cell and cause an uneven distribution of the radiation over its surface.

The angle $\psi$ is determined form the height H of the refectors 14. The height is directly proportional to the diameter of photo cell 17 divided by the selected angle of incidence is of the solar ray, where $i_s$ has the same value for all impinging rays.

From FIG. 3

$H = 2r \cos 30°/\tan i_s = 1.73 \cdot 2r/\tan i_s$, and $|\tan\psi| = -\tan(\pi - \psi) = H/r$ (2 cos 30° − 1), or tan $\psi = H/0.732r$ r = radius of photovoltaic cell 17.

The width of each collector 13 at its aperture is equal to two times the apothem where the apothem for a hexagon is equal to the radius of the circumscribed circle. Where the photovoltaic cell is four inches in diameter r = 2", the diameter of the circumscribed circle 25 is 2×4" and the radius is 4", multiplied by cos 30°, or the width of each collector 13 is:

$$2(4 \cos 30°) = 6.928" = 17.597 \text{ cm}.$$

The size of angle $\psi$ can be determined by substituting the above values in the formula: $|\tan\psi| = H/r(2 \cos 30° − 1) = H/0.732r$.

In a solar array consisting of 30 collectors disposed in the manner shown in FIG. 1, with four inch diameter photovoltaic cells, the said thirty cells will intercept 0.9297 kw. of energy. However, employing a collector with the same overall area which will concentrate three times the amount of energy upon each photovoltaic cell the array will generate:

Watts = 30 × 0.45 × 2 × 3 = 81.0 watts of electrical energy, where thirty cells at one sun will produce:

Watts = 30 × 0.45 × 2 = 27.0.

Since 1 meter$^2$ intercepts 1000 watts of solar radiation, 0.9297 meters (the area of the example) will intercept 929.7 = 930 watts, of which 930−81.0 = 849 watts will be thermal energy. The percentage of intercepted solar energy converted to electrical energy is:

$$81 \times 100/930 = 8.71\%$$

To protect the solar conversion panel 10 from damage by dust, rain, or snow, and to prevent corrosion of the collectors 11, a window 27 should be placed over the assembly and sealed to the side walls 20, as shown in FIG. 6, to form an enclosure 28. The enclosure 28 should be filled with a non-corrosive inert gas such as nitrogen or helium.

The windows 27 used to protect the panel 10 from the elements must be either glass or a transparent plastic. In order for these windows to withstand winds of sixty miles per hour or more, the area of the windows must be relatively small. Alternately, a neutralizing pressure synchronized with the wind pressure may be applied to the interior of the enclosure 28.

FIG. 6 illustrates somewhat diagrammatically, one type of pressure equalizer 29 which is automatically synchronized with the wind. It consists of a housing 30 closed at one end 31. An elastomeric flexible bellows 32 closed at one end 33 is disposed within the housing 30 with its open end sealed to the edge 33a of the open end of the housing. An enclosed volume 34 is thus provided within the housing 30. The enclosed volume 34 is in communication with the enclosure 28 of the panel 10 by a fluid line 35. The diameter of the bellows 32 is selected to balance out the volume of the enclosure 28 so that pressure on the window 27 will be balanced out by pressure at the open end of the bellows 32 which will cause a corresponding pressure in the gas within the enclosure 28.

Two axles 36 37, when properly mounted, allow the solar energy conversion panel to be rotated so that windows 27 will always face the sun, and while in general the pressure regulator 29 will be fixed in a suitable position, it will parallel the window in the panel close enough to make the pressure differentials caused by wind and temperature relatively small. The concentrators must be positioned to face the sun by means of a heliostat and while the calculations are made for thirty cells, a unit consisting of many more cells with a greater output can be constructed.

It will be understood, that the photovoltaic cells described herein may be of any type and connected together either in parallel or in series, without departing from the present invention.

Having thus fully described the invention, what is claimed and desired to be secured by Letters Patent is:

1. A solar energy conversion panel comprising a hollow support having spaced top and bottom plates and side walls enclosing a chamber between the support, a plurality of hollow hexagonally shaped energy collectors of a generally conical shape disposed with their larger dimensioned ends in closely packed edge to edge relationships, the reduced ends of said collectors being secured to the top plate and extending upwardly therefrom to receive the solar energy, a phtovoltaic cell secured to the top plate and within each of the energy collectors at the reduced end thereof in good thermal contact with said top plate sloped radiant liquid reflecting surfaces on the interior of each of the energy collectors angularly disposed with respect to the photovoltaic cell therein whereby all of the light incident upon the energy collectors will be received upon the photovoltaic cells, the angle of the slope of the light reflecting surfaces of the collectors being disposed in accordance with the formula;

$H = 2r \cos 30°/\tan i_s = 1.732r/\tan i_s$  $|\tan\psi| = \tan(\pi - \psi) = H/r (2 \cos 30° - 1) = H/0.732r$ Where:
$H$ = height of collector
$\psi$ = the angle between each reflecting surface and the photovoltaic cell.
$r$ = radius of photovoltaic cell $i_s$ = the angle of incidence of the solar ray, whereby a uniform angle of incidence of the light on the surface of the solar cells is achieved after a single reflection from the light reflective surfaces, and;

a fluid carried within the chamber, a fluid bearing line forming a closed loop in communication with said chamber and having an entrance and an exit port in said chamber and means to circulate the fluid in the chamber through the fluid bearing line to remove thermal energy from said chamber for use elsewhere.

2. A solar conversion panel according to claim 1 in which the height H of the collector is computed in accordance with the formula:

$$H = 2r \cos 30°/\tan i_s = 1.73 \; 2r/\tan i_s$$

3. A solar collector according to claim 1 in which a transparent window overlies the solar energy collectors and the side walls to form a fluid tight chamber around said collectors.

4. A solar collector according to claim 3 in which the chamber is filled with a gas, and a gas pressure regulator is coupled to the interior of the chamber by a conduit.

5. A solar collector according to claim 4 in which the gas pressure regulator comprises a housing closed at one end, a bellows closed at one end and secured at its opposite end to the open end of the housing to form a chamber between the housing and the bellows and one end of the conduit is in communication with the said chamber.

* * * * *